United States Patent [19]

Hideshima et al.

[11] Patent Number: 4,616,144
[45] Date of Patent: Oct. 7, 1986

[54] HIGH WITHSTAND VOLTAGE DARLINGTON TRANSISTOR CIRCUIT

[75] Inventors: Makoto Hideshima, Tokyo; Wataru Takahashi; Kenichi Muramoto, both of Kawasaki, all of Japan

[73] Assignee: Kabushiki Kaisha Toshiba, Kawasaki, Japan

[21] Appl. No.: 680,659

[22] Filed: Dec. 12, 1984

[30] Foreign Application Priority Data

Dec. 14, 1983 [JP] Japan ................................ 58-235383

[51] Int. Cl.⁴ ............................................ H03K 19/08
[52] U.S. Cl. .................................. 307/315; 307/254; 307/300; 307/296 R
[58] Field of Search ........... 307/315, 300, 254, 296 R; 357/46

[56] References Cited

U.S. PATENT DOCUMENTS 4,404,478  9/1983  Rischmüller ...................... 307/315
4,539,492  9/1985  Michel et al. ..................... 307/317 R

OTHER PUBLICATIONS

Nishiumi et al., "High Voltage High Power Transistor Modules for 440 V AC Line Voltage Inverter Applications," IPEC, Conf. Rec., vol. 1, p. 297, Mar. 1983.

Primary Examiner—Stanley D. Miller
Assistant Examiner—B. P. Davis
Attorney, Agent, or Firm—Finnegan, Henderson, Farabow, Garrett & Dunner

[57] ABSTRACT

A high withstand voltage Darlington transistor circuit is comprised of a Darlington transistor and a bypass circuit. This bypass circuit is comprised of a bypass transistor whose collector is connected to the base of an earlier stage transistor of the transistors which make up the Darlington transistor and whose emitter is connected to the base of a later stage transistor. The base of the bypass transistor is connected to the collector of the Darlington transistor via a diode and the resistor. When the collector-emitter voltage of the Darlington transistor crosses a specified value, the bypass transistor operates and a base current of the Darlington transistor is supplied to the base of the later stage transistor without being supplied to the earlier stage transistor. The result is that the current amplification ratio of the Darlington transistor is substantially decreased, and the withstand voltage is substantially increased.

11 Claims, 7 Drawing Figures

HIGH WITHSTAND VOLTAGE DARLINGTON TRANSISTOR CIRCUIT

BACKGROUND OF THE INVENTION

This invention relates to a high withstand voltage Darlington transistor circuit in which the breakdown tolerance when the load is short-circuited is increased.

Recently, high power Darlington transistors have come into wide spread use for inverter circuits for AC motor control, control circuits for DC motor control and emergency power supply, etc. In particular, they are being used as semiconductor devices for switching large currents in high power circuits. These high withstand voltage Darlington transistors commonly must be able to conduct a current, when turned on, of 10 Å to 1000 Å, and be able to withstand a voltage of 450 V to 1000 V, when turned off.

An example of a circuit, which uses such high withstand voltage Darlington transistors for large current switching, is shown in FIG. 1. Darlington transistor Q1 comprises Darlington-connected transistors Q11, Q12. As is shown, collector C and emitter E of Darlington transistor Q1 are connected in series with load 11, fuse 13 and power source 15 for controlling load 11 by turning on and off. In general, Darlington transistors also include stabilizing circuits, speed up diodes, and fast recovery diodes, etc., description of which has been omitted. Darlington transistor Q1 turns on when a current is supplied to its base B, and the emitter E and collector C are virtually short-circuited. When, on the other hand, current is not supplied, Darlington transistor Q1 is turned off, and the collector-emitter path remains substantially open.

Darlington transistor Q1 is required to not breakdown when load 11, for example, a motor, short-circuits, until fuse 13 blows. For example, in FIG. 1, if the power source voltage Vcc is taken to be 480 V (AC), in the forward safe operation area characteristic (particularly the load short circuit safe operation area characteristic) and at an operating temperature of (100°-125° C.), Darlington transistor Q1 is required not to breakdown for over 10 $\mu$sec., when a voltage of 800 V (DC) is applied.

The breakdown tolerance in the load short circuit safe operating area is determined by the area of the collector and by the electrical power, as is disclosed in "High Voltage High Power Transistor Modules for 440 V AC Line Voltage Inverter Applications" IPEC, March 1983, Conf. REC. Vol. 1, pp 297–305. It is also known that this breakdown tolerance also depends on the collector resistance Rc of Darlington transistor Q1. Consequently, in the past, in order to increase the breakdown tolerance, the collector resistance Rc was increased. For example, as shown in FIG. 2, with a transistor that has a cross-sectional structure comprising an N type emitter 21, P type base 23, N type low concentration intrinsic region 25 and N type collector region 27; that is, a so-called NP$\nu$N transistor, the intrinsic region 25 is thickened vertically and the collector resistance Rc is increased to increase the breakdown tolerance. However, the increase in collector resistance Rc results in a drop in the various forward characteristics of the transistor. The problems that occur, for example, are an increase in the saturation voltage Vce(sat) between the collector C and emitter E, an increase in the switching time and a drop in the collector peak current. A drop in any of the characteristics is undesirable in large current switching transistors. If the problem concerned only a drop in the saturation voltage Vce(sat) or collector peak current, this could be solved by increasing the emitter area of the transistor. However, with an increase in emitter area comes an increase in the total size of the chip. This results in an undesirable increase in the cost of the transistor. Also, even if the emitter area is increased, it is impossible to decrease the switching time. Accordingly, up till now, a large current switching Darlington transistor, which satisfied both the economic demands and the operating characteristics, has not been available.

SUMMARY OF THE INVENTION

In consideration of the above, the object of this invention is to provide a Darlington transistor for switching large current, which is both economical and has sufficient withstand ability.

The Darlington transistor circuit of this invention comprises:

at least two transistors, which form a Darlington transistor, the emitter of the earlier stage of any one of two transistors which are contiguous being connected to the base of the later stage transistor, and the collectors of both the earlier and later stage transistors being commonly connected; and bypass means, connected to said Darlington transistor, for supplying a base current, which is supplied to a first transistor of said Darlington transistor, to the base of the second transistor at a later stage than the first transistor without supplying it to the first transistor, when the voltage between collector and emitter of said Darlington transistor is larger than the saturation voltage of said Darlington transistor and when it larger than the specified voltage within the safe operation area of said Darlington transistor.

With this kind of structure, when there is a short circuit in the load of the high withstand voltage Darlington transistor, the current amplification ratio decreases substantially. Consequently, when the load is short circuited and the Darlington transistor is turned on, the current momentarily flowing in the transistor is greatly reduced over that of the prior art. Consequently, there is a large increase in the time until breakdown of the Darlington transistor is reached. As a result of which, there is a substantial improvement in the breakdown tolerance, the collector resistance does not increase, there is no deterioration in the operating characteristics, and the emitter area is not increased. Accordingly, there is no increase in the size of the chip, and the device is economical.

DETAILED DESCRIPTION OF THE PREFERRED EMBODIMENTS

Figure 3:
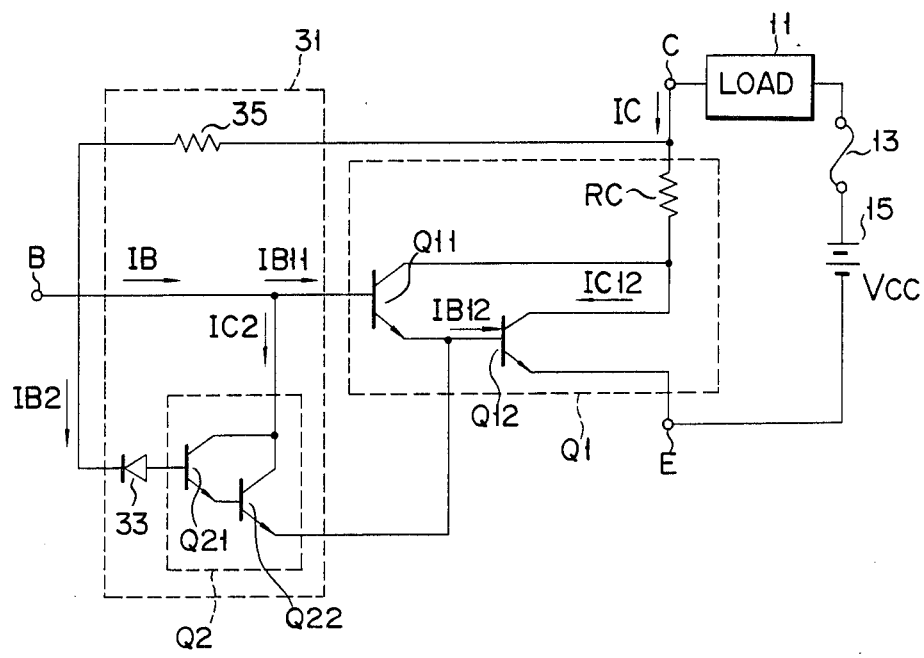
FIG. 3 is a circuit diagram of a circuit which uses a switching Darlington transistor according to the first embodiment of this invention.

The following is a description of the first embodiment of the invention taken in conjunction with FIG. 3. FIG. 3 is circuit diagram of a circuit to which has been applied a Darlington transistor circuit according to the first embodiment of the invention. The same reference numerals have been used for the same parts as in FIG. 1, and a description of which has been omitted. The feature of the circuit shown in FIG. 3 is the provision of a bypass circuit 31 in the circuit shown in FIG. 1. The Darlington transistor Q1 is also for switching current and controlling the load 11. The bypass circuit 31 has a bypass transistor Q2 formed of the two transistors Q21, Q22, which are Darlington connected. The collector of bypass transistor Q2 is connected to the base (the base of the Darlington transistor Q1) of transistor Q11 and the emitter is connected to the base of transistor Q12. The base of the bypass transistor Q2 is connected to the anode of diode 33. The cathode of diode 33 is connected to one terminal of resistor 35, and the other terminal of resistor 35 is connected to the collector of Darlington transistor Q1.

The following is a description of the operation of the above circuit. First, the operation when the load 11 is in a normal state (not short-circuited) will be described. When base current IB is not supplied to Darlington transistor Q1, the transistor Q11, Q12 are both off and, accordingly, Darlington transistor Q1 is off and the collector-emitter path C - E is substantially open. Power source voltage Vcc is applied to the collector-emitter path at this time. If the voltage Vcc of power source 15 is larger than the reverse withstand voltage of diode 33, the base current IB2 of the value shown in Equation (1) is normally supplied to the base of bypass transistor Q2 via resistor 35 and diode 33.

$$IB2 = (Vcc - Vz - Vf \times 3)/R \qquad (1)$$

where Vz is the reverse breakdown (Zener breakdown) voltage of diode 33, R is the resistance value of resistor 35, Vf is the forward voltage drop between the base and emitter of transistors Q21, Q22, Q12. These may vary slightly owing to IB2, but it is approximately 0.7 V as is known.

However, as will be explained later, by suitably selecting the resistance value R of resistor 35, it is possible to ignore the current IB2, without any effect on the circuit. In order to turn on Darlington transistor Q1, base current IB is supplied to it. When the voltage between collector and emitter E is larger than the reverse withstand voltage of diode 33, base current IB2, shown by equation (1), is supplied to the base of bypass transistor Q2, which as a result is turned on. Accordingly, if the current amplification ratio of bypass transistor Q2 is set at hfe2, the base current IB flows as the collector current IC2 of transistor Q2 until the value reaches IB2×hfe2. Consequently, current IB11 becomes 0 and, in reality no current is supplied to the base of transistor Q11.

On the other hand, currents IC2 and IB2 become the base current IB12 of transistor Q12, which is supplied to transistor Q12. Thus, with the transistor Q11 off, only transistor Q12 is on. Transistor Q2 operates along the load line determined by load 11 and collector resistance Rc, and the collector-emitter voltage gradually drops. When this collector-emitter voltage becomes lower than the reverse withstand voltage Vz of diode 33 (more accurately Vz+Vf×3, but this is often ignored because Vf is normally smaller than Vz), base current IB2 is interrupted by diode 33 and becomes zero. Namely, a current is no longer supplied to the base of bypass transistor Q2. The result of this is that bypass transistor Q2 is turned off and its collector current IC2 becomes zero. Base current IB is then supplied to transistor Q11 as is, transistors Q11, Q12 are both turned on, and the collector-emitter voltage drops to the saturation voltage of Darlington transistor Q1. In this way, by supplying or interrupting the current to base B, it is possible to turn Darlington transistor Q1 on and off and control load 11.

The following is a description of the circuit operation when load 11 is short circuited. In this case, voltage Vcc is directly applied to Darlington transistor Q1 so current IB2, shown by equation (1), is normally supplied to the base of transistor Q21. Accordingly, bypass transistor Q2 is normally on. Suppose base current IB is supplied to the base of Darlington transistor Q1 in this state. If the current amplification ratio of bypass transistor Q2 is set to hfe2, base current IB flows as collector current IC2 of bypass transistor Q2 until the value reaches IB2×hfe2. Current IB11 becomes zero and, in reality, no current is supplied to transistor Q11. Accordingly, the base current IB12 to transistor Q12 can be shown by the following equation.

$$IB12 = IB + (IB/hfe2) \qquad (2)$$

where, if hfe2 is sufficiently large, IB12=IB. Collector current IC of Darlington transistor Q1 can be shown by the following equation if the current amplification ratio of transistor Q12 is taken to be hfe12.

$$IC = IB \times hfe12 \qquad (3)$$

Figure 1:
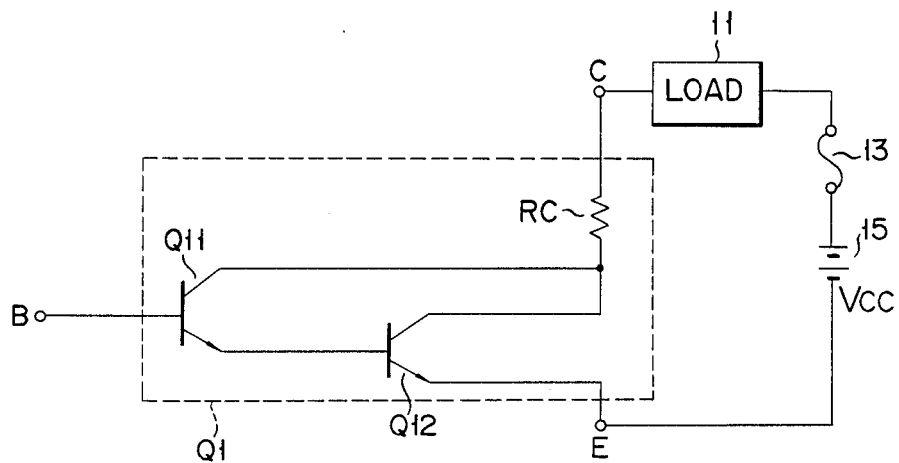
FIG. 1 is a circuit diagram of an example of a circuit which uses a prior art Darlington transistor for switching.

With the prior art circuit shown in FIG. 1, the collector current IC of Darlington transistor Q1, when the current amplification ratio of transistor Q11 is hfe11, can be shown be the following equation.

$$IC = IB \times hfe11 \times hfe12 \qquad (4)$$

As is clear from equations (3) and (4), when a base current IB is supplied to Darlington transistor Q1 with the load 11 short-circuited, the collector current IC of Darlington transistor Q1 is smaller than in the prior art device by an amount equal to the current amplification ratio hfe11 of transistor Q11. Normally, the current amplification ratio hfe11 is of a two or three digit order.

In this embodiment, when a base current IB is input with the load 11 shorted, the current which momentarily flows in Darlington transistor Q1 is much smaller than in the prior art. Consequently, the time until the breakdown of Darlington transistor Q1 is very long. Which is to say, the breakdown tolerance of Darlington transistor Q1 becomes large. At this time, the collector resistance Rc does increase compared with the prior art and, accordingly, the characteristics such as the saturation voltage Vce(sat) of the Darlington transistor, the collector peak voltage and the delay time after turning off, etc. are not lost as compared to the prior art Darlington transistor.

As was stated in the description of equation (1), when the collector-emitter voltage is larger than the reverse breakdown voltage Vz of diode 31 (more accurately Vz+Vf×3), current IB2 normally flows via transistors Q21, Q22, Q12. For example, when Darlington transistor Q1 is off, normally current IB2 flows as a leakage current. When the value of current IB2 is large, Darlington transistor Q1 is not turned off completely and the collector current IC flows. Accordingly, it is desirable that the resistance value R of resistor 35 be sufficiently large. For example, if the tolerance value of current IB2 (leakage current) is taken to be in the 1 m Å range, the resistance value R of resistor 35 is automatically determined by power source voltage Vcc. When the current amplification ratio hfe2 of bypass transistor Q2 is small, a relationship such as that shown by equation (5) arises. At this time, the current IB11, shown by equation (6) is supplied to the base of transistor Q11.

$$IB \geq IB2 \times hfe2 \quad (5)$$

$$IB11 = IB - IB2 \times hfe2 \quad (6)$$

Consequently, transistor Q11 is on and the base current IB12 supplied to transistor Q12 becomes as shown by the following equation.

$$IB12 = IB2 \times hfe2 + (IB - IB2 \times hfe2) \times hfe11 \quad (7)$$

It is very easy to increase the second function on the right side of equation (7) and, as a result, the collector current IC of Darlington transistor Q1 becomes large and Darlington transistor Q1 breaks down easily. Accordingly, it is necessary that the current amplification ratio hfe2 of bypass transistor Q2 be large enough that at least the equation (5) not hold true. For example, if current IB is 2 Å and current IB2 is 1 m Å, it is necessary that hfe2 be at least over 2K.

Figure 2:
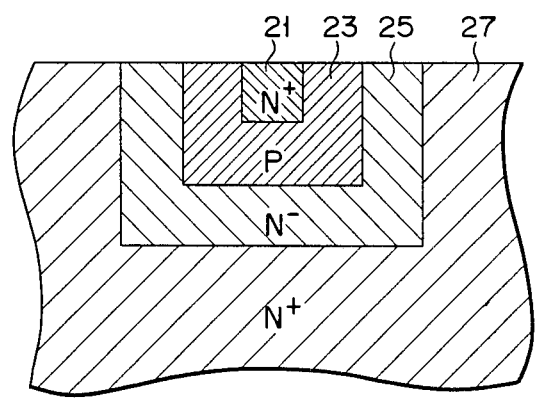
FIG. 2 is a cross section of an NP$\nu$N transistor.

The reverse breakdown voltage Vz of diode 33 substantially determines collector-emitter voltage of Darlington transistor Q1 when bypass circuit 31 operates. When this reverse breakdown voltage Vz is small, bypass transistor Q2 is normally on, transistor Q11 is normally off, and the saturation voltage of Darlington transistor Q1 is determined only by the saturation voltage of transistor Q12 and is not small enough. Also, if the reverse breakdown voltage Vz is too large, bypass transistor Q2 does not operate at all, and the circuit shown in FIG. 2 readily reaches secondary breakdown, the same as the circuit of FIG. 1. Accordingly, it is necessary that voltage Vz be smaller than the voltage that results in the breakdown of Darlington transistor Q1 when bypass circuit 31 is not used. So, it is desirable that voltage Vz be higher than the saturation voltage of Darlington transistor Q1 but lower than its breakdown voltage (within the safe operation area).

Figure 4:
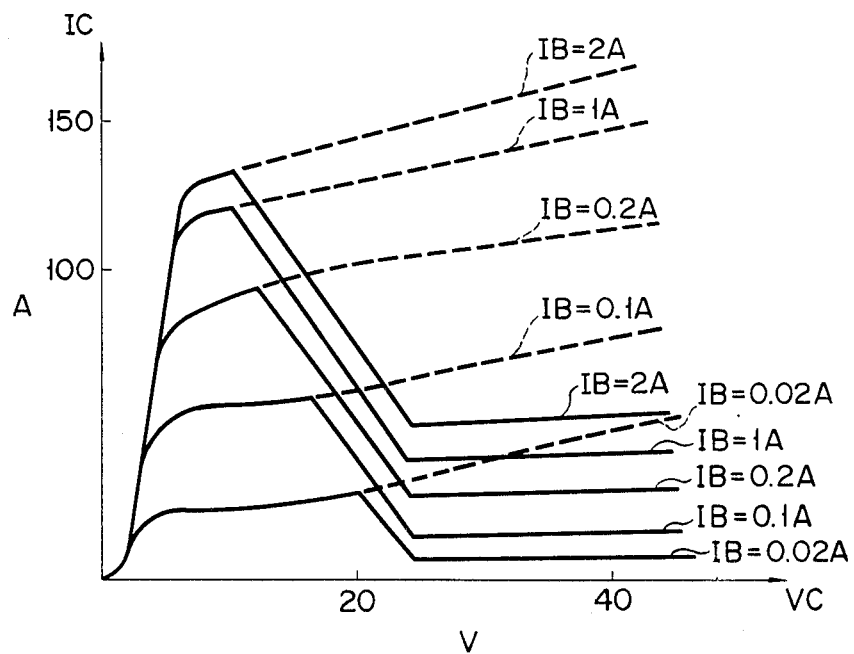
FIGS. 4 and 5 show the relationship between the collector current and the collector-emitter voltage of the Darlington transistor according to this invention.
Figure 5:
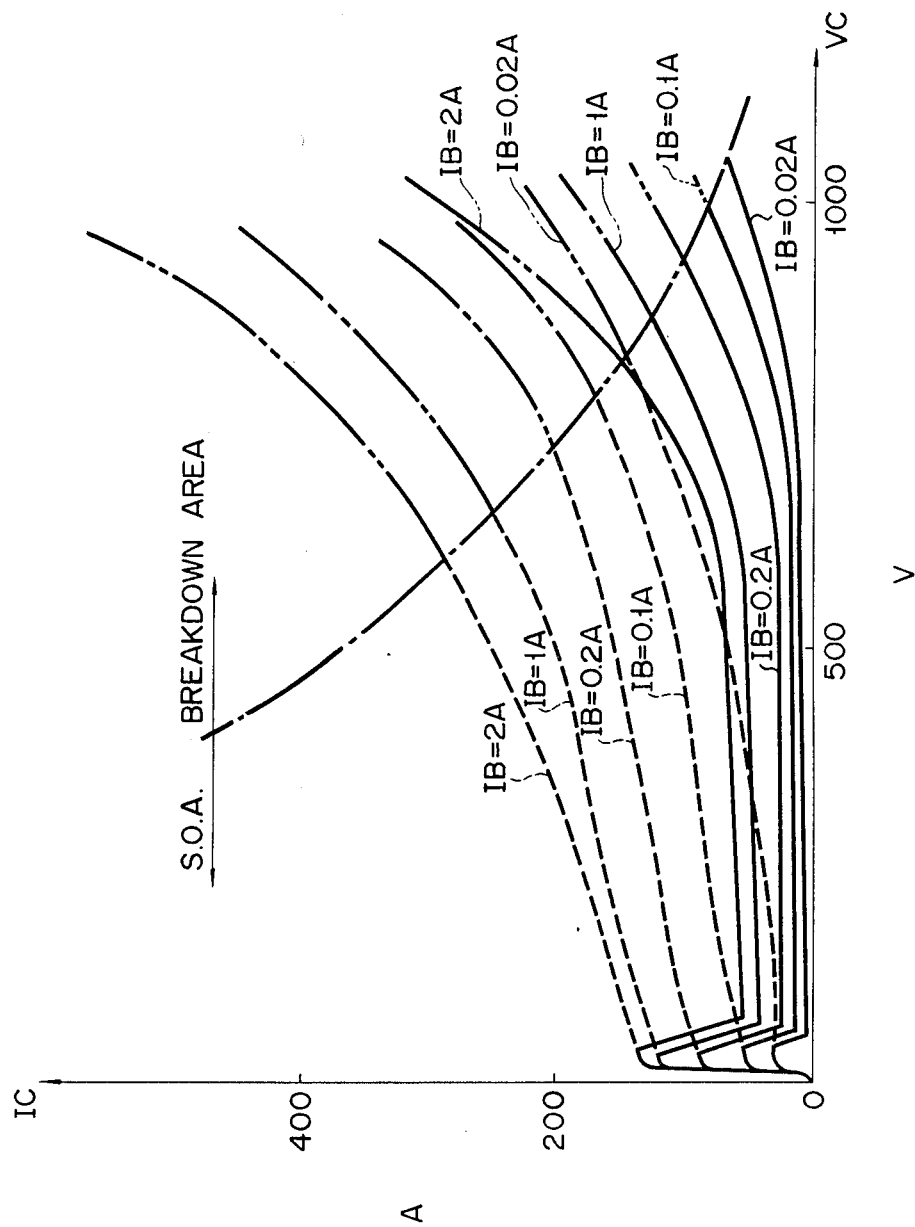

Tests were conducted on a Darlington transistor Q1 having a bypass circuit 31 of the first embodiment of this invention. In this test, the resistance value R of resistor 35 was set at 1 MΩ, the reverse breakdown voltage Vz at 10 V, and the current amplification ratio hfe2 of bypass transistor Q2 at approximately 2K. A base current having a pulse width of 50 μsec. was supplied to base B. Also, in the test the base current IB was varied in five stages of 2 Å, 1 Å, 0.2 Å, 0.1 Å and 0.02 Å. FIGS. 4 and 5 show the resulting relationships of the collector current IC and the collector-emitter voltage VC of Darlington transistor Q1. The IC-VC characteristics of Darlington transistor Q1 are shown with (solid line) and without (broken line) bypass circuit 31. FIG. 4 shows the low voltage characteristics and FIG. 5 shows the high voltage characteristics. Also, in FIG. 5 the two-dot broken line shows the extrapolated characteristics of the element after breakdown (the characteristics in the breakdown region). The one-dot broken line shows the breakdown-nonbreakdown borderline that depends on collector resistance Rc of Darlington transistor Q1. For example, in case of a NPνN transistor, it depends only on the thickness of the intrinsic region, as was described earlier.

Figure 6:
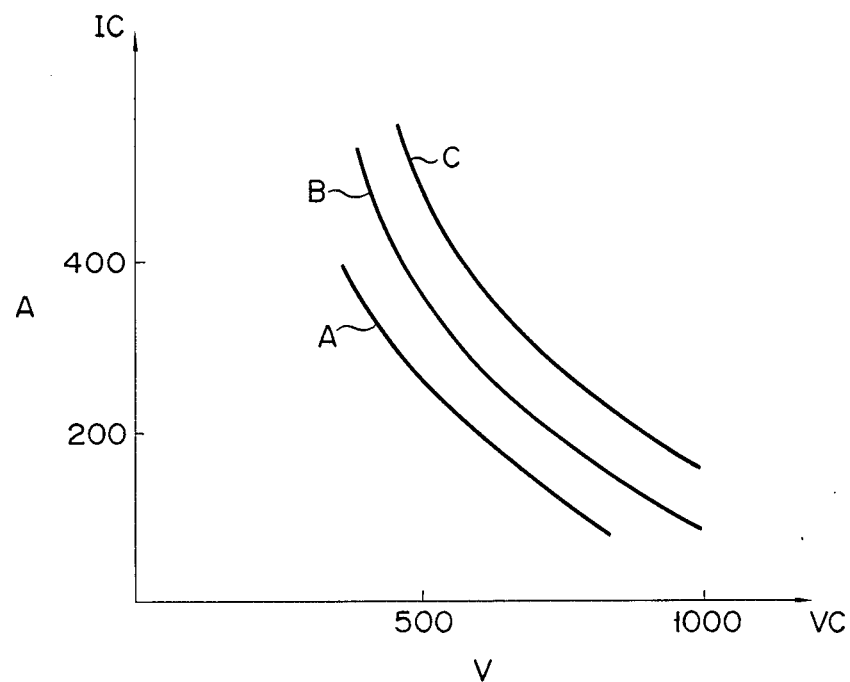
FIG. 6 shows the relationship between the thickness of the intrinsic region of the NP$\nu$N transistor and the borderline between the breakdown region and the safe operating region.

FIG. 6 shows the relationship between the borderline and the thickness of the intrinsic region of transistor Q12. Because the current flowing across transistor Q11 is small, there is no particular problem with the thickness of the intrinsic region of transistor Q11. In this case, the resistance ratio of the intrinsic region is 110 Ω·cm. The IC-VC characteristic curves A, B, C show the characteristics when the thickness of the intrinsic region is 60 μm, 100 μm and 140 μm. In actual use, curve B is the limit, because of the other characteristics of the transistors Q12. As is shown in FIGS. 4 and 5, when the bypass circuit 31 of this invention is used and the collector-emitter voltage VC crosses a specified value (Vz+Vf×3), the current amplification ratio of Darlington transistor Q1 drops sharply and the collector current IC is greatly reduced. Accordingly, it was confirmed that the breakdown tolerance of Darlington transistor Q1 was greatly improved. For example, with the prior art Darlington transistor Q1 to which is supplied a 2 Å base current IB, when a collector-emitter voltage VC of 600 V is applied, a momentary collector current IC of 280 Å flows, and within several μsec. the silicon melts and the collector-emitter path is short-circuited. On the other hand, when the bypass circuit 31 of this invention is used, the collector current IC is approximately 75 Å and lasts for 50 μsec. so there was no breakdown. Also, when the base current IB was 2 Å, the current IC was 130 Å even when 800 V was applied to the collector-emitter path, and even when flowing for 50 μsec. the Darlington transistor Q1 did not breakdown.

Figure 7:
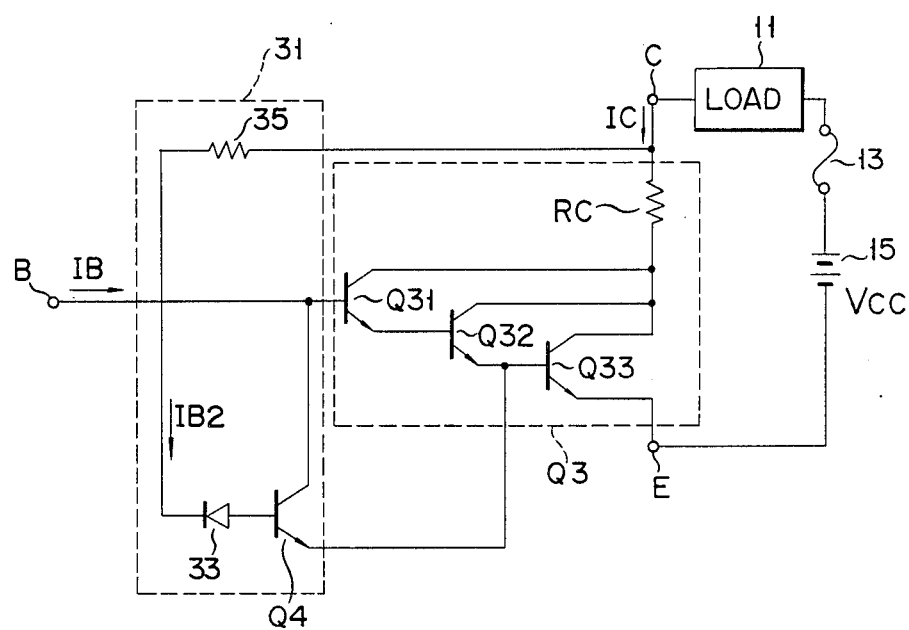
FIG. 7 is a circuit diagram of a circuit which uses a Darlington transistor according to another embodiment of the invention.

FIG. 7 shows another embodiment of this invention. The same reference numerals have been used for the same parts as shown in FIG. 3 and description of which has been omitted. In this circuit, the Darlington transistor Q3 for switching current is formed of three transistors Q31, Q32, Q33 and the bypass transistor is formed of one transistor Q4. In this case, as well, when the collector-emitter voltage is larger than the voltage Vz+Vf×2 (substantially voltage Vz of diode 33), base current IB is supplied to the base of transistor Q33 via bypass transistor Q4 without being applied to transistor Q31. With this circuit, when transistor Q4 does not operate, the collector current IC is as shown by the following equation (8) and, when it does operate the current IC is as shown in equation (9).

$$IC = IB \times hfe31 \times hfe32 \times hfe33 \quad (8)$$

$$IC = IB \times hfe33 \quad (9)$$

In this case, hfe31, hfe32, hfe33 are the current amplification ratios of the transistors Q31, Q32 and Q33.

In this way, in this embodiment as well, the current amplification ratio of Darlington transistor Q3 is decreased by hfe31×hfe32 and, accordingly, when load 11 short-circuits and a base current IB is applied, the collector current IC, which flows momentarily, is decreased, which results in an increase in the breakdown tolerance of Darlington transistor Q3. As was described earlier, so that equation (5) is not satisfied, it is necessary that current amplification ratio hfe4 of bypass transistor Q4 be sufficiently large so that a base current is not supplied to transistor Q31. Correspondingly, the minimum value of current amplification ratio hfe4 is automatically determined by the current values of IB2 and IB.

The above descriptions were of Darlington transistors formed of two and three transistors. However, this invention is not limited to this, and four or five transistors many be connected. Also, in the above embodiments, the bypass transistors Q4 and Q2 were formed of one or two transistors. However, this invention is not limited to this, and they may be formed of three or four transistors. It is to be noted, however, that in regard to the currents IB and IB2, the current amplification ratios must be sufficiently large such that the relationship of equation (5) does not occur.

In the above embodiments, NPN transistors were used but it is possible to use PNP transistors as well.

The purpose of diode 33 is to set the voltage standard for the operation of bypass circuit 31. Accordingly, when the collector-emitter voltage is large enough for the base current IB2 to flow, and when bypass transistor Q2 is formed of many transistors, this diode 33 is not particularly necessary. Diode 33 may be of any construction if base current IB2 flows when the collector-emitter voltage is larger than a specified value. For example, it may be a Zener diode or it may be a multi-stage serially connected diode with its anode connected to resistor 35, its cathode to transistor Q5 or Q2.

In the above embodiments, the collectors of bypass transistors Q2 and Q4 were connected to the base of first stage transistors Q11, Q31, and the emitters of these transistors were connected to the base of transistor Q12, Q33, which was the last stage of the transistors forming the Darlington transistor. This invention is not limited to this, however. For example, with the circuit shown in FIG. 7, the collector of bypass transistor Q4 may be connected to the base of transistor Q32 and the emitter may be connected to the base of transistor Q33. The collector of bypass transistor Q4 may also be connected to the base of transistor Q32 and the emitter to the base of transistor Q33. Any kind of construction is possible providing than when the collector-emitter voltage is larger that a specified value, the current amplification ratio of the Darlington transistor Q3 becomes substantially smaller.

It is also possible for the emitters of bypass transistors Q2, Q4 to be connected to the emitters E of Darlington transistors Q1, Q3. In this case, for example, during the transistion of Darlington transistor Q1 from off to on, if equation (10) is satisfied, the entire base current IB flows across bypass circuit 31 and Darlington transistor does not turn on at all.

$$IB \leq IB2 \times hfe2 \tag{10}$$

However, if resistance R of resistor 35, the collector-emitter voltage and the current amplification ratio hfe2 of bypass transistor Q2 is selected such that equation (11) is satisfied, Darlington transistor Q1 will perform the switching operation.

$$IB \geq IB2 \times hfe2 \tag{11}$$

What is claimed is:

1. A Darlington transistor circuit comprising:
   a Darlington transistor comprising at least two contiguous transistors, an earlier stage transistor and a later stage transistor, each having a base, a collector and an emitter, of which the emitter of the earlier stage transistor is connected to the base of the later stage transistor, said later stage emitter constituting an emitter of the Darlington transistor, and the collectors of both earlier and later stage transistors are connected in common and constitute a collector of the Darlington transistor; and
   bypass means, having a first, second and third terminal, said first terminal connected to the collector of said Darlington transistor, said second terminal connected to the base of said earlier stage transistor and said third terminal connected to the base of said later stage transistor, such that when the voltage between the collector and emitter of said Darlington transistor is higher than a specified voltage, which specified voltage is higher than a saturation voltage of said Darlington transistor, and which specified voltage is within the safe operation area of said Darlington transistor, said bypass means is operative to cause a base current, which is normally supplied to the base of said earlier stage transistor, to substantially flow to the base of said later stage transistor, while substantially interrupting the supply of the base current to the base of said earlier stage transistor, to thereby substantially decrease the current amplification ratio of said Darlington transistor.

2. A Darlington transistor circuit according to clam 1, wherein said bypass means is comprised of a bypass transistor whose collector is connected to the base of said first transistor, the emitter is connected to the base of said second transistor, and the base is connected to the collector of said Darlington transistor.

3. A Darlington transistor circuit according to claim 2, wherein said bypass transistor has a large current amplification ratio.

4. A Darlington transistor circuit according to claim 2, wherein said bypass transistor is a bypass Darlington transistor with a large current amplification ratio.

5. A Darlington transistor circuit according to claim 2, wherein said bypass means includes a diode connected in series between the base of bypass transistor and the collector of Darlington transistor.

6. A Darlington transistor circuit according to claim 2, wherein the reverse breakdown voltage of said diode is larger than the saturation voltage of said Darlington transistor and is within the safe operation area of said Darlington transistor.

7. A Darlington transistor circuit according to claim 2, wherein said bypass means includes a resistor connected in series between the base of bypass transistor and the collector of said Darlington transistor.

8. A Darlington transistor circuit according to claim 2, wherein said bypass means supplies the base current of the earliest stage transistor of the transistors comprising said Darlington transistor as the base current of the last stage transistor.

9. A Darlington transistor circuit according to claim 1, wherein said Darlington transistor circuit further includes a power source, load means connected to said power source and said Darlington transistor circuit, said Darlington transistor switching current to control said load means.

10. A high withstand voltage Darlington transistor circuit comprising:
- a Darlington transistor having a base, collector and emitter for switching large current, said Darlington transistor having at least a first and second transistor, both said first and second transistors having a base, collector and emitter; and
- bypass means, including a bypass transistor having a base, collector and emitter, connected at said collector to the base of said first transistor, and connected at said emitter to a base of said second transistor, which is at a later stage than said first transistor, a resistor connected in series between said base of said bypass transistor and the collector of said Darlington transistor, and a diode connected in series with said resistor, said bypass means being connected to the bases of said first and second transistors and to the collector and emitter of said Darlington transistor, such that when the voltage between the collector and emitter of said Darlington transistor is higher than a specified voltage, which specified voltage is higher than a saturation voltage of said Darlington transistor, and which specified voltage is within the safe operation area of said Darlington transistor, said bypass means is operative to cause a base current, which base current is normally supplied to said first transistor of said Darlington transistor, to substantially flow to the base of said second transistor, while substantially interrupting the supply of base current to said first transistor, thereby substantially decreasing the current amplification ratio of said Darlington transistor.

11. A Darlington transistor circuit comprising:
a Darlington transistor having a base, collector and emitter and having at least an earlier stage transistor and a later stage transistor, each having a collector, emitter and a base, the emitter of said earlier stage transistor being connected to the base of said later stage transistor, and the collectors of both earlier and later stage transistors being connected in common;

a base current supply means, connected to the bases of said earlier and later stage transistors, for normally supplying a base current to the base of said earlier stage transistor of said Darlington transistor; and sensor means, connected to the collector and the emitter of said Darlington transistor and to said base current supply means for sensing the voltage between said collector and emitter, said sensor means being operative to cause said base current supply means to supply the base current to said later stage transistor at times when said sensed collector-emitter voltage is higher than a specified voltage.

* * * * *